(12) United States Patent
Yabumoto et al.

(10) Patent No.: US 9,548,664 B2
(45) Date of Patent: Jan. 17, 2017

(54) GATE-POWER-SUPPLY DEVICE AND SEMICONDUCTOR CIRCUIT BREAKER USING SAME

(71) Applicant: Mitsubishi Electric Corporation, Chiyoda-ku (JP)

(72) Inventors: Takuya Yabumoto, Chiyoda-ku (JP); Kazufumi Tanaka, Chiyoda-ku (JP); Hiroyasu Iwabuki, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/889,269

(22) PCT Filed: Jul. 25, 2014

(86) PCT No.: PCT/JP2014/069686
§ 371 (c)(1),
(2) Date: Nov. 5, 2015

(87) PCT Pub. No.: WO2015/016146
PCT Pub. Date: Feb. 5, 2015

(65) Prior Publication Data
US 2016/0099650 A1   Apr. 7, 2016

(30) Foreign Application Priority Data

Aug. 1, 2013 (JP) ................................ 2013-160357

(51) Int. Cl.
*H02M 3/335* (2006.01)
*H03K 17/10* (2006.01)
(Continued)

(52) U.S. Cl.
CPC ........... *H02M 3/33507* (2013.01); *H02M 1/08* (2013.01); *H03K 17/107* (2013.01);
(Continued)

(58) Field of Classification Search
CPC .................................................. H02M 3/33569
See application file for complete search history.

(56) References Cited

U.S. PATENT DOCUMENTS

2013/0038975 A1  2/2013  Hafner et al.
2015/0381075 A1*  12/2015  Qu .................... H02M 3/33576
                                                  363/132

FOREIGN PATENT DOCUMENTS

JP         8-17656        1/1996
JP       2002-272134      9/2002
(Continued)

OTHER PUBLICATIONS

International Search Report issued Oct. 14, 2014, in PCT/JP2014/069686, filed Jul. 25, 2014.

*Primary Examiner* — Daniel Puentes
(74) *Attorney, Agent, or Firm* — Oblon, McClelland, Maier & Neustadt, L.L.P.

(57) ABSTRACT

A gate-power-supply device is provided with an inverter circuit, a transformer, and rectifier circuits. The device includes secondary-side parallel capacitors, connected in parallel to secondary-side coils of the transformer, for cancelling inductance components of the secondary-side coils at the drive frequency of the inverter circuit. The device includes a primary-side series capacitor, connected in series to a primary-side coil of the transformer, for cancelling the imaginary term (inductance component) of the combined impedance of the gate drivers, the rectifier circuits, the secondary-side parallel capacitors, the secondary-side coils, transformer cores and the primary-side coil, which are a load viewed from the inverter circuit.

15 Claims, 14 Drawing Sheets

(51) Int. Cl.
*H03K 17/567* (2006.01)
*H02M 1/08* (2006.01)
*H03K 17/60* (2006.01)
H02H 7/26 (2006.01)
H03K 17/691 (2006.01)

(52) U.S. Cl.
CPC ......... *H03K 17/567* (2013.01); *H03K 17/601* (2013.01); *H02H 7/268* (2013.01); *H03K 17/691* (2013.01)

(56) References Cited

FOREIGN PATENT DOCUMENTS

| | | |
|---|---|---|
| JP | 2006-109686 | 4/2006 |
| JP | 2009-284562 | 12/2009 |
| JP | 2010-284027 | 12/2010 |
| WO | WO 2011/141054 A1 | 11/2011 |

\* cited by examiner (a)

(b)

GATE-POWER-SUPPLY DEVICE AND SEMICONDUCTOR CIRCUIT BREAKER USING SAME

TECHNICAL FIELD

The present invention relates to a gate-power-supply device suitable for a semiconductor circuit breaker and the like of a high-voltage direct current transmission system.

BACKGROUND ART

In conventional high-voltage DC transmission systems, in order to take measures against overcurrent accidents and the like in a transmission line, technologies have been invented that realize fast circuit breaking operation by using a semiconductor circuit breaker in which a plurality of semiconductor switches are connected in series (see Patent Document 1, for example). The problem here is power supply to gate drivers which open/close the semiconductor switches. For conventional gate-power-supply devices, a technology has been invented in which: transformer cores each wound with a secondary-side coil are provided for respective gate driver; a primary-side coil is provided so as to pass through hollow portions of the transformer cores; and high-frequency power is supplied to the primary-side coil, thereby supplying power to the gate drivers by the electromagnetic induction phenomenon (see Patent Document 2, for example).

CITATION LIST

Patent Document

Patent Document 1: WO2011-141054 (FIGS. 1-4)
Patent Document 2: Japanese Laid-Open Patent Publication No. 2009-284562 (paragraphs 0015-0017 and FIG. 3)

SUMMARY OF THE INVENTION

Problems to be Solved by the Invention

In the method as in Patent Document 2, in the case where power is supplied to the gate drivers for the semiconductor switches which form a semiconductor circuit breaker for a several hundred kV high-voltage DC transmission system, the potential difference between the primary-side coil and the secondary-side coils is several hundred kV.

Thus, there is a problem that the transformer core is made large in order to secure the insulation distance between the primary-side coil and each secondary-side coil.

In addition, when the transformer core is made large, the coefficient of coupling between the primary-side coil and the secondary-side coil is reduced, which causes the transformer to be a leakage transformer. Thus, on the secondary-side, output voltage is reduced in association with increase in output current.

Further, on the primary-side, in a load circuit viewed from an inverter circuit which supplies high-frequency power to the primary-side coil, the inductance component becomes predominant, which causes the switching devices of the inverter circuit to be in a hard switching state.

In order to solve the problems described above, an object of the present invention is to provide a small and highly-efficient gate-power-supply device that has high insulating property and that can stabilize voltage to be applied to the gate drivers.

Another object of the present invention is to provide a semiconductor circuit breaker suitable for a high-voltage DC transmission system, by using the gate-power-supply device as above.

Solution to the Problems

A gate-power-supply device according to the present invention is a gate-power-supply device including:

a DC power supply;

an inverter circuit for converting DC power from the DC power supply into high-frequency power and for outputting the high-frequency power;

a transformer composed of a primary-side coil supplied with the high-frequency power, and a plurality of secondary-side coils wound around transformer cores through which the primary-side coil passes;

a plurality of rectifier circuits for respectively rectifying high-frequency powers outputted from the respective secondary-side coils of the transformer, the plurality of rectifier circuits for respectively driving gate drivers for a plurality of semiconductor switching devices, by outputs from the rectifier circuits;

a plurality of secondary-side parallel capacitors connected in parallel to the respective secondary-side coils, the plurality of secondary-side parallel capacitors for canceling inductance components of the secondary-side coils at drive frequency of the inverter circuit; and a primary-side series capacitor connected in series to the primary-side coil, the primary-side series capacitor for canceling an imaginary term (inductance component) of a combined impedance of the gate drivers, the rectifier circuits, the secondary-side parallel capacitors, the secondary-side coils, the transformer cores, and the primary-side coil, which are a load viewed from the inverter circuit.

Effect of the Invention

According to the present invention, by providing the secondary-side parallel capacitors, inductance components of the secondary-side coils can be canceled, and output voltage drop dependent on output currents and inductance components of the secondary-side coils can be eliminated. By providing the primary-side series capacitor, output current from the inverter can be made to have a sine wave shape, and voltages to be applied to the gate drivers can be stabilized. In addition, the switching device of the inverter circuit can be in a soft switching state or a state close to the soft switching state, and thus, a small and highly-efficient gate-power-supply device that has high insulating property can be obtained.

In addition, by using the gate-power-supply device according to the present invention, a semiconductor circuit breaker suitable to a high-voltage DC transmission system can be easily obtained.

DESCRIPTION OF EMBODIMENTS

Embodiment 1

Figure 1:
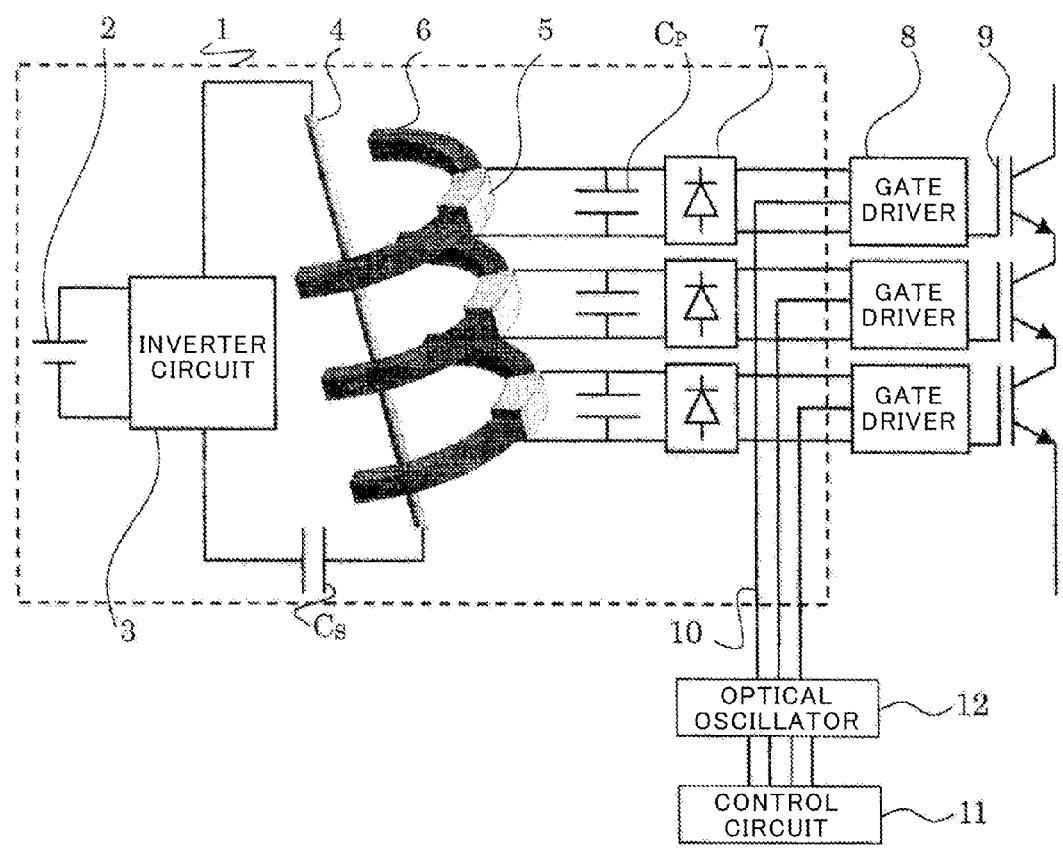
FIG. 1 is a circuit configuration showing a basic configuration in the case where a gate-power-supply device according to Embodiment 1 of the present invention is used in a semiconductor circuit breaker of a high-voltage DC transmission system.

In FIG. 1, a gate-power-supply device 1 is composed of: a DC power supply 2; an inverter circuit 3 for outputting high-frequency power; a transformer composed of a primary-side coil 4 supplied with high-frequency power by the inverter circuit 3, and a plurality of secondary-side coils 5 respectively wound around a plurality of transformer cores 6 (three in FIG. 1) through which the primary-side coil passes; and a plurality of rectifier circuits 7 for rectifying high-frequency power outputted from the respective secondary-side coils 5 of the transformer. A plurality of gate drivers 8 being a load are driven by outputs from the respective rectifier circuits 7.

The gate drivers 8 are respectively connected to a plurality of semiconductor switching devices (hereinafter, simply referred to as switching devices) 9 which are connected in series to a transmission line of a high-voltage DC transmission system. The gate drivers 8 supply driving powers to the gates of the switching devices 9.

On the other hand, each gate driver 8 is supplied with a control signal from a control circuit 11 via an optical oscillator 12 and a signal line 10. In accordance with this control signal, the corresponding switching device 9 is controlled to be ON or OFF. The control circuit 11 generates a control signal for turning off each switching device 9 in response to an accident condition such as overcurrent in the transmission line in the high-voltage DC transmission system.

The semiconductor circuit breaker of the high-voltage DC transmission system is composed of the gate-power-supply device 1, the gate drivers 8, and the switching devices 9.

In addition to the above configuration, as a feature of the present invention, in the gate-power-supply device 1, each secondary-side coil 5 is provided with a secondary-side parallel capacitor $C_P$ for canceling the inductance component of the secondary-side coil 5 at the drive frequency of the inverter circuit 3. In addition, the primary-side coil 4 is provided with a primary-side series capacitor $C_S$ for cancelling the imaginary term (inductance component) of the combined impedance of the gate drivers 8, the rectifier circuits 7, the secondary-side parallel capacitors $C_P$, the secondary-side coils 5, the transformer cores 6, and the primary-side coil 4, which are a load viewed from the inverter circuit 3.

FIG. 1 shows an example in which three secondary-side coils 5, three transformer cores 6, three rectifier circuits 7, three gate drivers 8, three switching devices 9, and three secondary-side parallel capacitors $C_P$ are provided. However, the number of these components may be changed as desired in accordance with the number of the switching devices 9.

Each transformer core 6 shown in FIG. 1 is formed in an arc shape having an opening as a part thereof, but this is one example and the shape is not limited thereto.

FIG. 1 shows each switching device 9 as an IGBT (insulated gate bipolar transistor), but the kind of the switching device 9 is not limited to IGBT.

For example, a switching device using a wide band gap semiconductor can also be used.

Moreover, the DC power supply 2 may supply DC power which is obtained by converting AC power from a two-phase or three-phase AC power-supply (not shown) through a rectifier circuit (not shown).

The inverter circuit 3 may have any circuit configuration, and for example, may be configured as a half bridge circuit or a full bridge circuit.

Similarly, the rectifier circuit 7 may have any circuit configuration, and for example, may be configured as a half-wave rectifier circuit, a full-wave rectifier circuit, or the like.

Furthermore, the gate driver 8 may have any circuit configuration, and a gate driver in the form of an IC may be used.

Next, a problem of a transformer composed of the primary-side coil 4, the secondary-side coils 5, and the transformer cores 6 in the above circuit configuration will be described.

Figure 2:
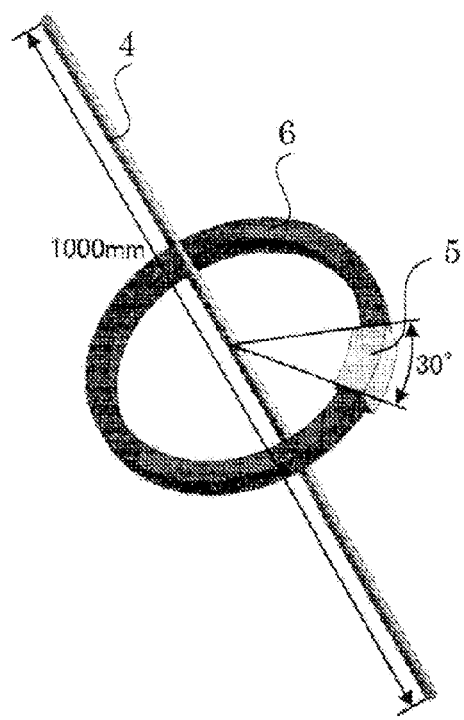
FIG. 2 shows an electromagnetic field simulation model of the transformer part according to Embodiment 1 of the present invention.
Figure 2:
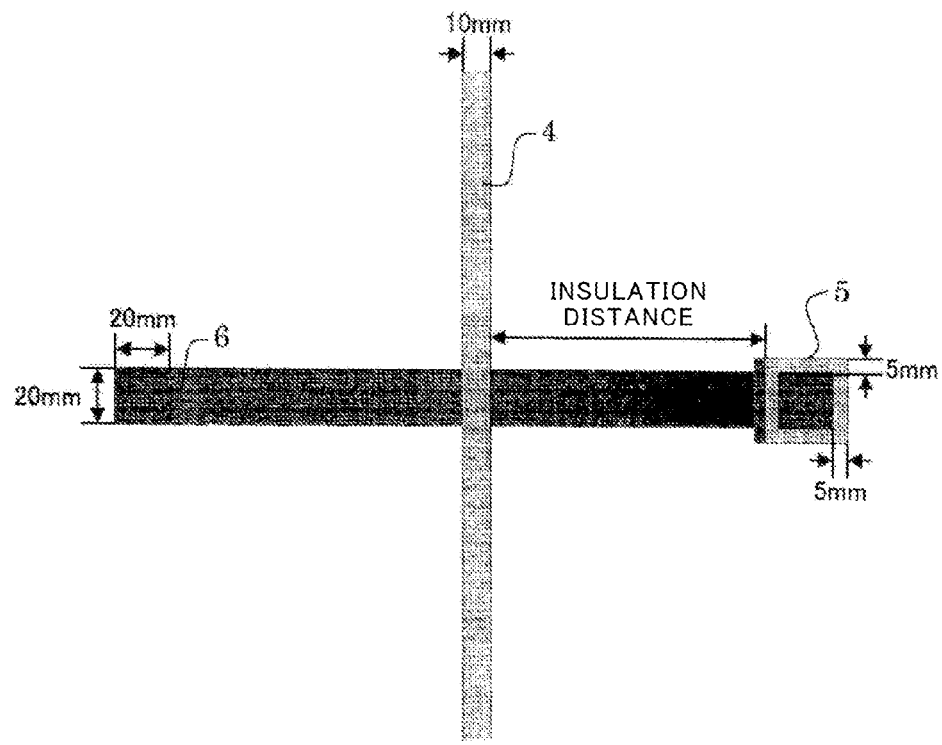

Here, for easy understanding, a case of one secondary-side coil 5 and one transformer core 6 is considered. First, as shown in FIG. 2, the primary-side coil 4 having a diameter of 10 mm and a length of 1000 mm and formed in one turn is passed through the center of the transformer core 6 in a toroidal shape whose cross section has a height of 20 mm and a width of 20 mm. The transformer core 6 is wound with the secondary-side coil 5 by 10 turns, by a thickness of 5 mm and in an angle of 30° along the transformer core 6.

Here, the distance between the primary-side coil 4 and the secondary-side coil 5 was defined as an insulation distance, and the relationship between the insulation distance and the coefficient of coupling was obtained through electromagnetic field simulation. The result is shown in FIG. 3.

Figure 3:
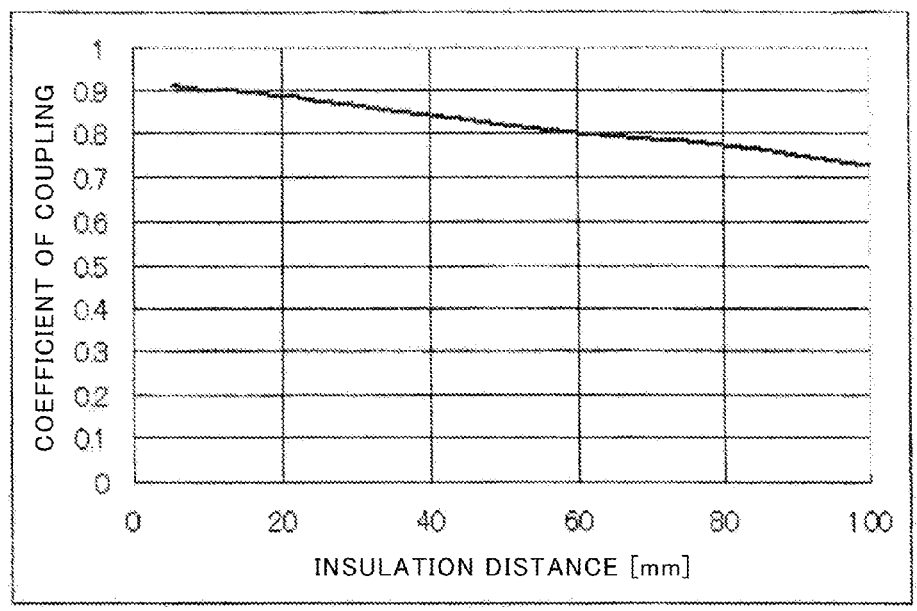
FIG. 3 is a graph showing the relationship between the insulation distance and the coefficient of coupling of the transformer part according to Embodiment 1 of the present invention.

From FIG. 3, it can be confirmed that the insulation distance and the coefficient of coupling is in a substantially proportional relationship, and that when the insulation distance is increased, the coefficient of coupling is decreased.

For example, in the case where the gate-power-supply device 1 as above is applied to a 300 kV high-voltage DC transmission system, since the dielectric breakdown voltage of air is about 3 kV/mm, an insulation distance of 100 mm or greater needs to be secured. This results in a larger transformer core 6 and a decreased coefficient of coupling.

Further, for reducing the size and the weight of the transformer core 6, electromagnetic field simulation was similarly conducted also with respect to a case where the transformer core 6 is provided with an opening so as to have an arc shape.

Figure 4:
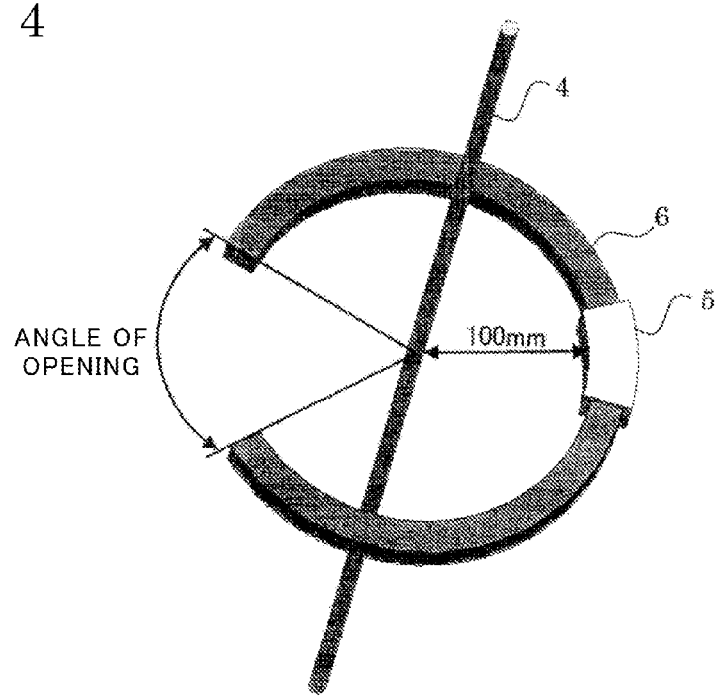
FIG. 4 shows an electromagnetic field simulation model of the transformer part in the case where there is an opening in the transformer core according to Embodiment 1 of the present invention.

As shown in FIG. 4, using as the reference the case of the insulation distance of 100 mm in the above electromagnetic field simulation, an opening was provided in the transformer core 6 on the opposite side of the secondary-side coil 5, and the relationship between the angle of the opening and the coefficient of coupling was obtained through electromagnetic field simulation. The result is shown in FIG. 5.

Figure 5:
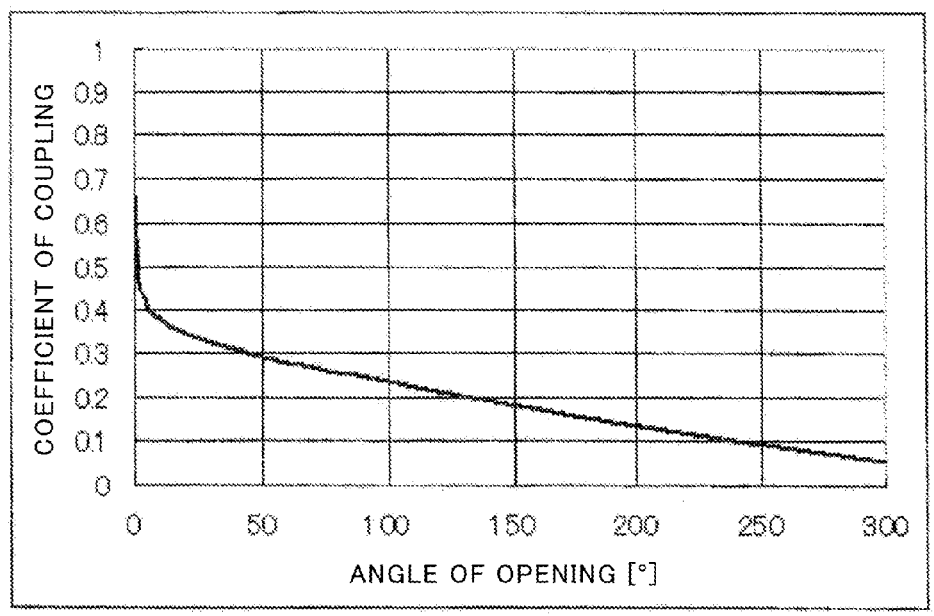
FIG. 5 is a graph showing the relationship between the angle of opening and the coefficient of coupling of the transformer part in the case where there is an opening in the transformer core according to Embodiment 1 of the present invention.

From FIG. 5, it can be confirmed that when even a small opening is provided in the transformer core 6, the coefficient of coupling is greatly decreased.

When the angle of the opening becomes large to some extent, the change in the coefficient of coupling becomes moderate.

The result of the above electromagnetic field simulation shows that, in the case where the gate-power-supply device 1 as above is applied to a semiconductor circuit breaker of a high-voltage DC transmission system, the transformer composed of the primary-side coil 4, the secondary-side coil 5, and the transformer core 6 will inevitably become a leakage transformer.

Figure 6:
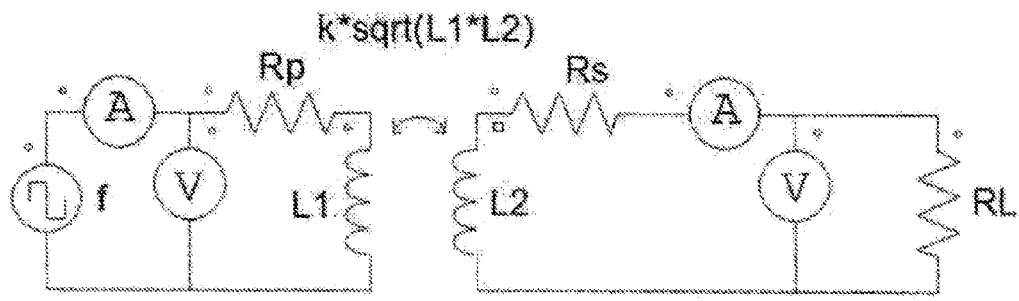
FIG. 6 shows a simulation circuit of the transformer part according to Embodiment 1 of the present invention.

Now, the problem caused when the transformer is a leakage transformer will be explained based on the result of circuit simulation. The simulation circuit is shown in FIG. 6.

Here, for easy understanding, a leakage transformer was connected to a power supply which outputs a rectangular wave simulating the output of a full bridge inverter, and a resistance load was connected to the output of the leakage transformer.

As the parameters of the leakage transformer, the result was used that had been obtained from the above electromagnetic field simulation where the insulation distance was 100 mm, the angle of the opening was 180°, and the primary-side current frequency was 10 kHz.

Figure 7:
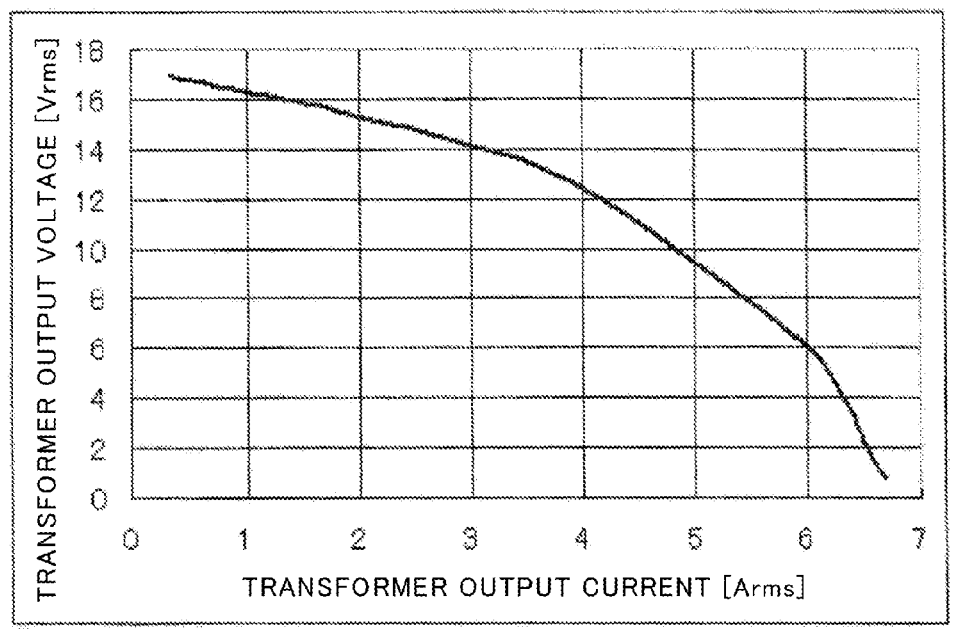
FIG. 7 is a graph showing the relationship between the transformer output voltage and the transformer output current obtained from the simulation circuit of the transformer part according to Embodiment 1 of the present invention.
Figure 8:
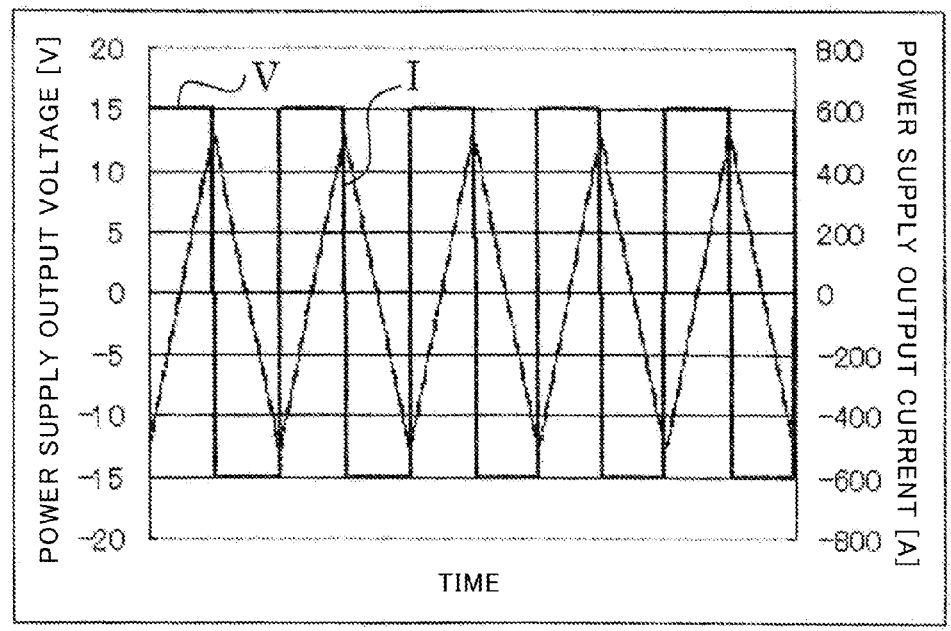
FIG. 8 is a graph showing the relationship between the power supply output voltage and the power supply output current obtained from the simulation circuit of the transformer part according to Embodiment 1 of the present invention.

Table 1 shows the constant and the definition of the parameters of the simulation circuit. The result from the circuit simulation is shown in FIG. 7 and FIG. 8.

TABLE 1

| Parameter | Constant | Definition |
|---|---|---|
| f | 10 kHz | Frequency of power supply |
| k | 0.155 | Coefficient of coupling |
| L1 | 0.718 µH | Inductance of primary-side coil |
| L2 | 39.002 µH | Inductance of secondary-side coil |
| Rp | 0.882 mΩ | Resistance of primary-side coil |
| Rs | 0.559 mΩ | Resistance of secondary-side coil |
| RL | Variable | Resistance load |

First, the result shown in FIG. 7 will be explained.

This shows the relationship between the transformer output voltage and the transformer output current obtained when the value of the resistance load RL was varied.

A characteristic can be confirmed that when the transformer output current is increased, the transformer output voltage is decreased.

This poses a problem that when power consumption in the gate driver 8 is abruptly changed, the transformer output voltage is decreased, thereby causing stop of the gate driver 8.

For a countermeasure to this problem, a method is conceivable in which a DC/DC converter or the like is mounted to the output of the transformer to stabilize the output voltage. However, this poses a problem of causing the device to be larger.

Next, the result shown in FIG. 8 will be explained.

This shows power supply output voltage V and power supply output current I in the case where resistance load RL=50Ω. It can be confirmed that the power supply output current I is in a triangular wave which has the positive maximum value or the negative maximum value at the timing when the polarity of the power supply output voltage V is reversed.

The timing when the polarity is reversed is the timing when the switching device (not shown) in the inverter circuit 3 performs switching, and thus, there is a problem that a large switching loss is caused because the switching is performed at the timing when the power supply output current I has the maximum value.

The present invention solves the problem as above, and has provided the secondary-side parallel capacitor $C_P$ for canceling the inductance component of the secondary-side coil 5 and the primary-side series capacitor $C_S$ for canceling the inductance component of the load circuit viewed from the inverter circuit 3, at the drive frequency $f_0$ of the inverter circuit 3.

Figure 9:
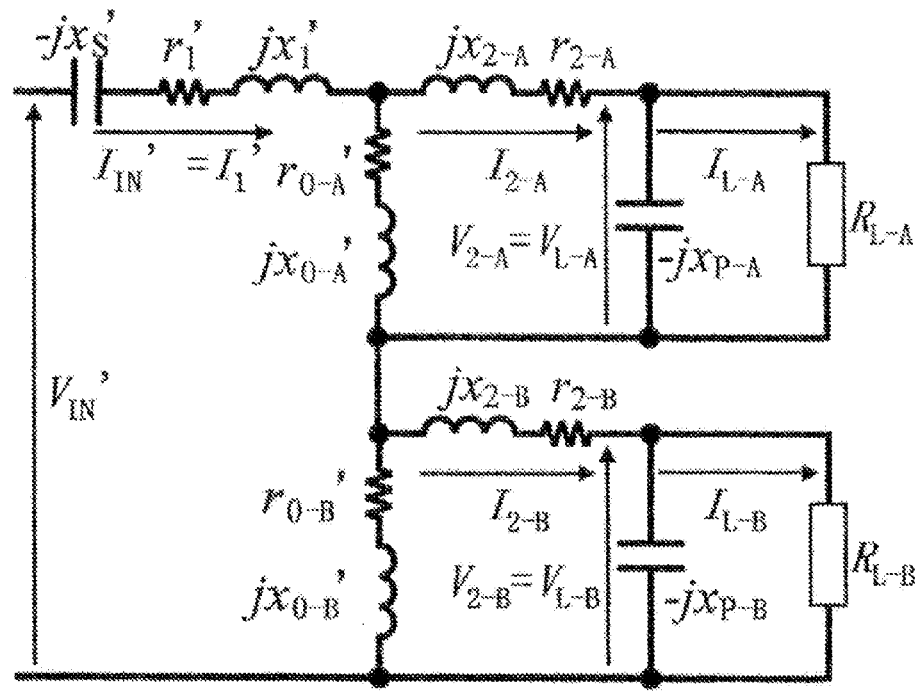
FIG. 9 shows a detailed equivalent circuit of the transformer part including capacitors and loads according to Embodiment 1 of the present invention.

Effects of the provision of the secondary-side parallel capacitor $C_P$ and the primary-side series capacitor $C_S$ will be explained. FIG. 9 shows a detailed equivalent circuit of a case where the secondary-side parallel capacitor $C_P$ and the primary-side series capacitor C are added to the transformer composed of the primary-side coil 4, the secondary-side coil 5, and the transformer core 6, and the resultant transformer is connected to the resistance load $R_L$ simulating the rectifier circuit 7 and the gate driver.

The transformer may be provided with one or more secondary-side units. However, for easy understanding, a case where the transformer is provided with two secondary-side units will be explained here.

Here, the turns ratio is defined as $a=N_1/N_2$, and each primary-side parameter is expressed as its corresponding secondary-side parameter and indicated with "'" (dash).

Since there are two secondary-side units of the transformer, a subscript A will be attached to each parameter relating to a first secondary-side unit, and a subscript B will be attached to each parameter relating to a second secondary-side unit.

Thus, in FIG. 9, $R_{L-A}$ and $R_{L-B}$ each represent resistance load, $r_{0-A}'$ and $r_{0-B}'$ each represent excitation resistance (iron loss) expressed as secondary-side parameter, represents primary-side coil resistance expressed as secondary-side parameter, $r_{2-A}$ and $r_{2-B}$ each represent secondary-side coil resistance, $x_{0-A}'$ and $x_{0-B}'$ each represent excitation reactance expressed as secondary-side parameter, $x_1'$ represents primary-side leakage reactance expressed as secondary-side parameter, $x_{2-A}$ and $x_{2-B}$ each represent secondary-side leakage reactance, $x_S'$ represents reactance of primary-side series capacitor expressed as secondary-side parameter, and $x_{P-A}$ and $x_{P-B}$ each represent reactance of secondary-side parallel capacitor.

Here, $r_{0-A}'$ and $r_{0-B}'$ each representing iron loss, and the coil resistances $r_1'$, $r_{2-A}$, and $r_{2-B}$ are sufficiently small compared with the reactances $x_{0-A}'$, $x_{0-B}'$, $x_1'$, $x_{2-A}$, and $x_{2-B}$ at the drive frequency $f_0$ of the inverter circuit 3, and thus, are omitted.

Figure 10:
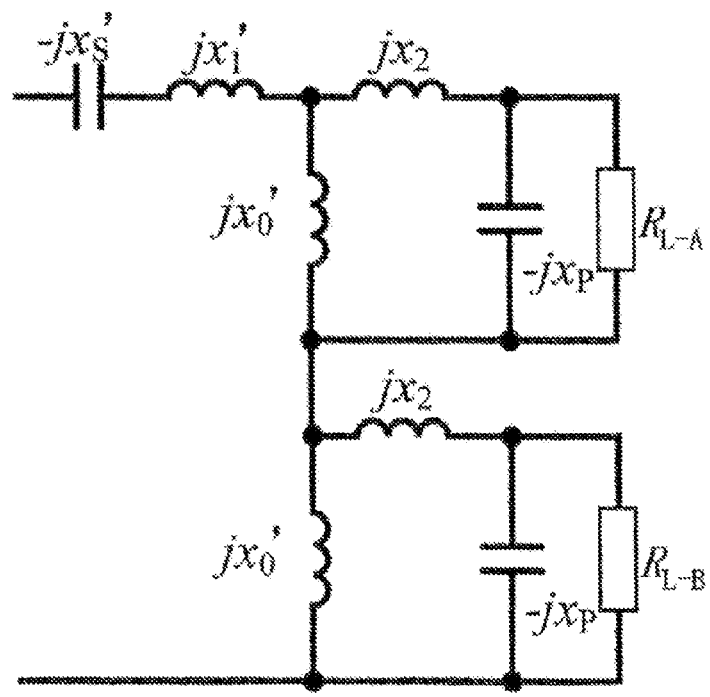
FIG. 10 shows a simple equivalent circuit of the transformer part including the capacitors and the loads according to Embodiment 1 of the present invention.

Use of components respectively having different specifications on the secondary-side of the transformer will result in increased costs. Thus, if it is assumed to use components having the same specification, the following relationship is established. Accordingly, a simple equivalent circuit shown in FIG. 10 is obtained.

$$x_0'=x_{0-A}'=x_{0-B}'$$

$$x_2=x_{2-A}=x_{2-B}$$

$$x_P=x_{P-A}=x_{P-B} \qquad [\text{Math. 1}]$$

Figure 11:
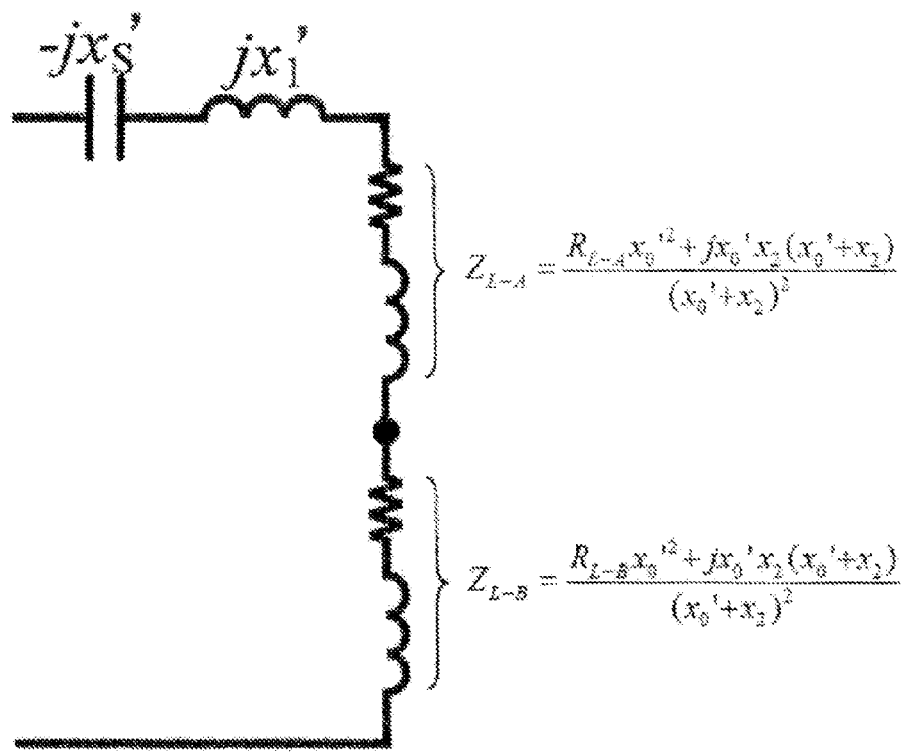
FIG. 11 shows a simple equivalent circuit modification 1 of the transformer part including the capacitors and the loads according to Embodiment 1 of the present invention.

In the simple equivalent circuit shown in FIG. 10, when the value of the secondary-side parallel capacitor $C_P$ is determined so as to cancel the secondary-side coil inductance $L_2$, the combined impedances $Z_{L-A}$ and $Z_{L-B}$ on the secondary-side are expressed in the following expressions, respectively. Accordingly, a simple equivalent circuit modification 1 shown in FIG. 11 is obtained.

$$1/\omega_0 C_P = x_P = x_0' + x_2 = \omega_0 L_2$$

$$Z_{L-A} = \{R_{L-A}x_0'^2 + jx_0'x_2(x_0'+x_2)\}/(x_0'+x_2)^2$$

$$Z_{L-B} = \{R_{L-B}x_0'^2 + jx_0'x_2(x_0'+x_2)\}/(x_0'+x_2)^2 \qquad [\text{Math. 2}]$$

When the combined impedance of the simple equivalent circuit modification 1 shown in FIG. 11 is defined as Z, the imaginary part Z_Im of the combined impedance of the simple equivalent circuit modification 1 is expressed by the following expression.

$$Z\_Im = \{2x_0'x_2/(x_0'+x_2)\} + x_1' - x_S \qquad [\text{Math. 3}]$$

Thus, the value of the primary-side series capacitor $C_S$ is determined by the following expression.

$$1/\omega_0 C_S' = x_S' = \{nx_0'x_2/(x_0'+x_2)\} + x_1' (n=2) \qquad [\text{Math. 4}]$$

where n is the number of the secondary-side units.

Figure 12:
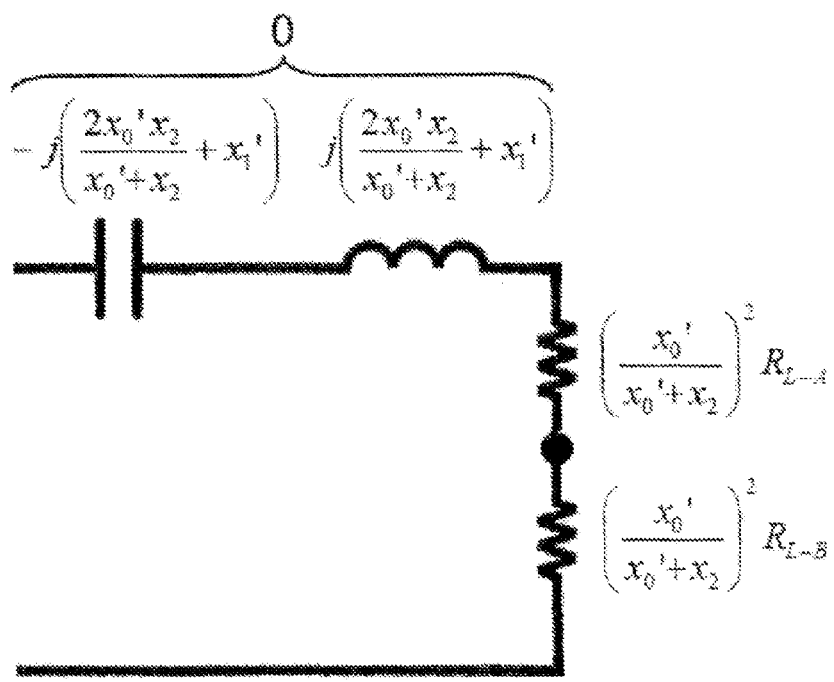
FIG. 12 shows a simple equivalent circuit modification 2 of the transformer part including the capacitors and the loads according to Embodiment 1 of the present invention.

FIG. 12 shows a simple equivalent circuit modification 2 obtained when the value of the primary-side series capacitor $C_S$ is determined by [Math. 4].

With reference to FIG. 12, the equivalent circuit becomes an LCR series circuit having a power factor of 1, the current waveform has a sine wave shape, and thus, switching loss of the inverter circuit 3 becomes substantially 0.

In addition, the voltage applied to the resistance loads $R_L$ is dependent only on the output voltage of the inverter circuit 3, the excitation reactance $x_0$, the leakage reactance $x_2$, the turns ratio a, and the ratio between the resistance loads $R_L$ respectively connected to the secondary-side units.

At this time, in a system where the loads arbitrarily change, the ratio between the loads is not constant, and thus, the voltages applied to the respective loads are not constant. However, in the case where power is supplied to the gate drivers 8 for the switching devices 9 which form the semiconductor circuit breaker of a high-voltage DC transmission system, all the switching devices 9 need to be turned ON/OFF simultaneously. Thus, all the loads composed of the rectifier circuits 7 and the gate drivers 8 change at the same timing.

That is, the ratio between the loads is always constant, and thus, the voltages applied to the respective loads do not vary.

Therefore, without providing voltage adjusting means such as a DC/DC converter, it is possible to stabilize the voltages applied to the respective gate drivers 8.

Finally, effects of the invention are confirmed by a circuit simulation.

Figure 13:
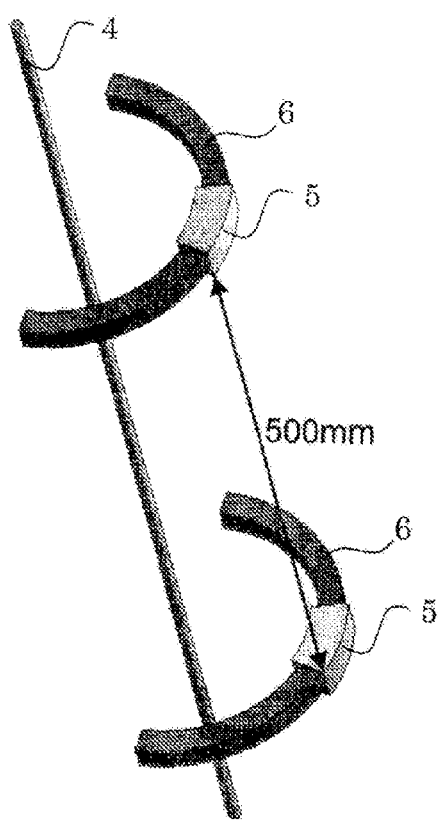
FIG. 13 shows an electromagnetic field simulation model of the transformer part in the case where there is an opening in the transformer core and there are two secondary-side units according to Embodiment 1 of the present invention.

Parameters of the leakage transformer were obtained by analyzing an electromagnetic field simulation model shown in FIG. 13.

This electromagnetic field simulation model was obtained by setting the angle of the opening at 180°, providing two secondary-side coils 5 and two transformer cores 6, and setting the distance between the secondary-side coils 5 at 500 mm in the electromagnetic field simulation model shown in FIG. 4.

Figure 14:
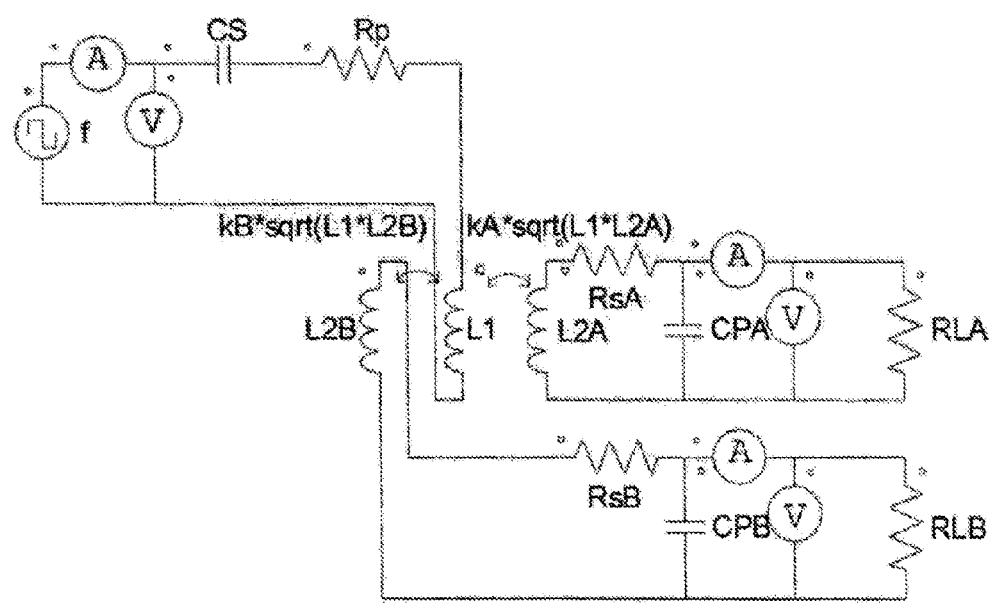
FIG. 14 shows a simulation circuit in the case where there are two secondary-side units of the transformer part including the capacitors and the loads according to Embodiment 1 of the present invention.

FIG. 14 shows a simulation circuit and Table 2 shows the constant and the definition of parameters of the simulation circuit.

TABLE 2

| Parameter | Constant | Definition |
|---|---|---|
| f | 10 kHz | Frequency of power supply |
| kA | 0.151 | Coefficient of coupling between primary-side and secondary-side A |

TABLE 2-continued

| Parameter | Constant | Definition |
|---|---|---|
| kB | 0.151 | Coefficient of coupling between primary-side and secondary-side B |
| L1 | 0.781 μH | Inductance of primary-side coil |
| L2A | 21.551 μH | Inductance of secondary-side coil A |
| L2B | 21.551 μH | Inductance of secondary-side coil B |
| Rp | 0.904 mΩ | Resistance of primary-side coil |
| RsA | 0.580 mΩ | Resistance of secondary-side coil A |
| RsB | 0.580 mΩ | Resistance of secondary-side coil B |
| RLA | Variable | Resistance load of secondary-side A |
| RLB | Variable | Resistance load of secondary-side B |
| CS | Calculated by [Math. 4] | Capacitance of primary-side series capacitor |
| CPA | Calculated by [Math. 2] | Capacitance of secondary-side parallel capacitor A |
| CPB | Calculated by [Math. 2] | Capacitance of secondary-side parallel capacitor B |

Figure 15:
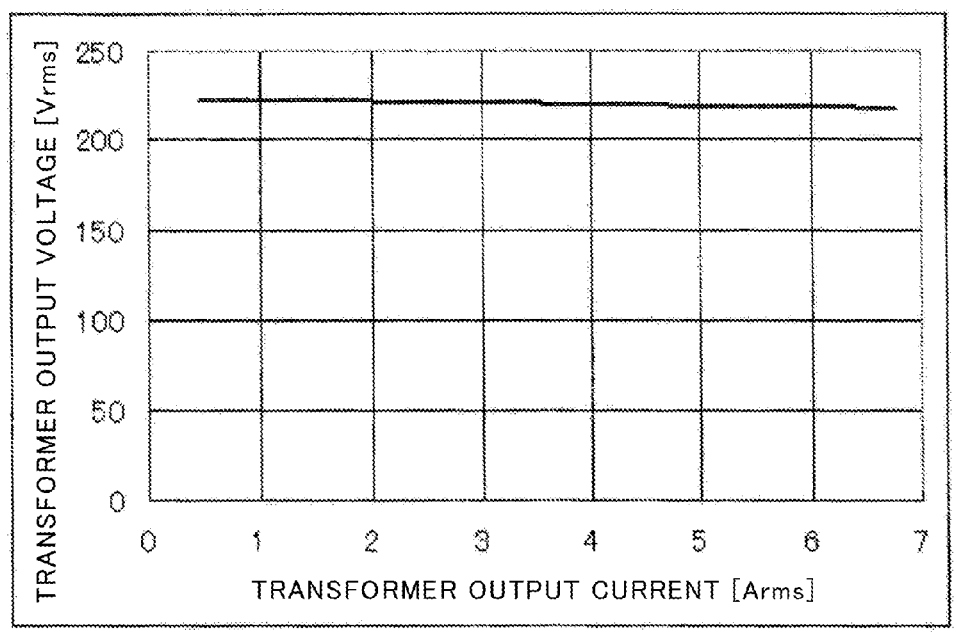
FIG. 15 is a graph showing the relationship between the transformer output voltage and the transformer output current obtained from a simulation circuit in the case where there are two secondary-side units of the transformer part including the capacitors and the loads according to Embodiment 1 of the present invention.

FIG. 15 is a graph showing the relationship between the transformer output current and the transformer output voltage obtained when the resistance loads RLA and RLB were changed.

Figure 16:
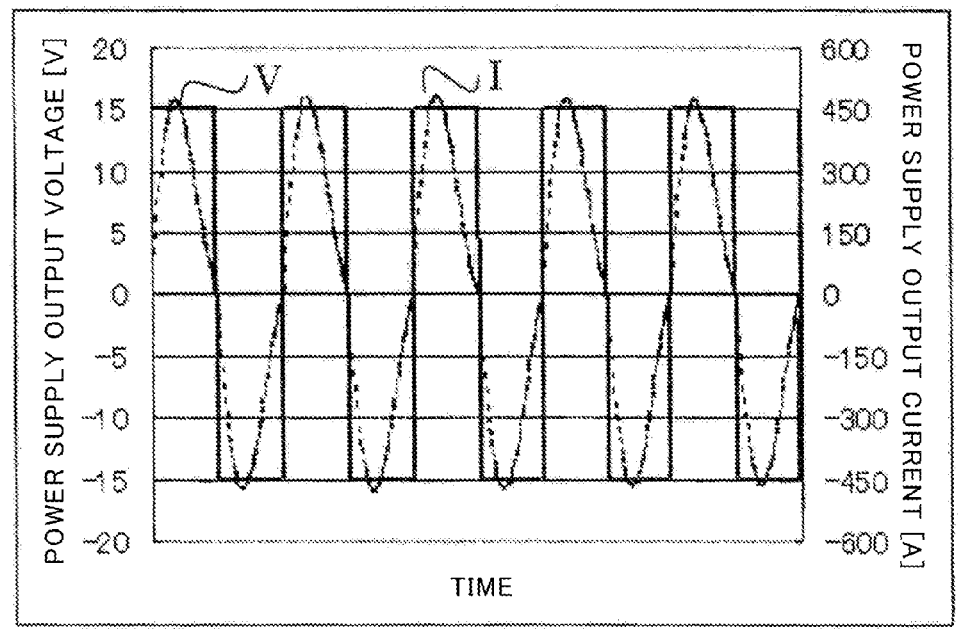
FIG. 16 is a graph showing the relationship between the power supply output voltage and the power supply output current obtained from the simulation circuit in the case where there are two secondary-side units of the transformer part including the capacitors and the loads according to Embodiment 1 of the present invention.

It can be confirmed that even when the transformer output current is increased, the transformer output voltage can be kept substantially constant. FIG. 16 is a graph showing the power supply output voltage V and the power supply output current I obtained when resistance load RLA=RLB=25Ω.

It can be confirmed that the power supply output current I substantially has a sine wave shape, and becomes substantially zero at the timing when the polarity of the power supply output voltage V is changed.

Thus, switching loss of the inverter circuit 3 is substantially zero.

Embodiment 2

In Embodiment 1, when the secondary-side coils 5 are magnetically coupled with each other, the circuit becomes complicated, and cancelling inductance components becomes difficult. Thus, the secondary-side coils 5 are disposed sufficiently distanced from each other, which, however, results in a larger device.

Figure 17:
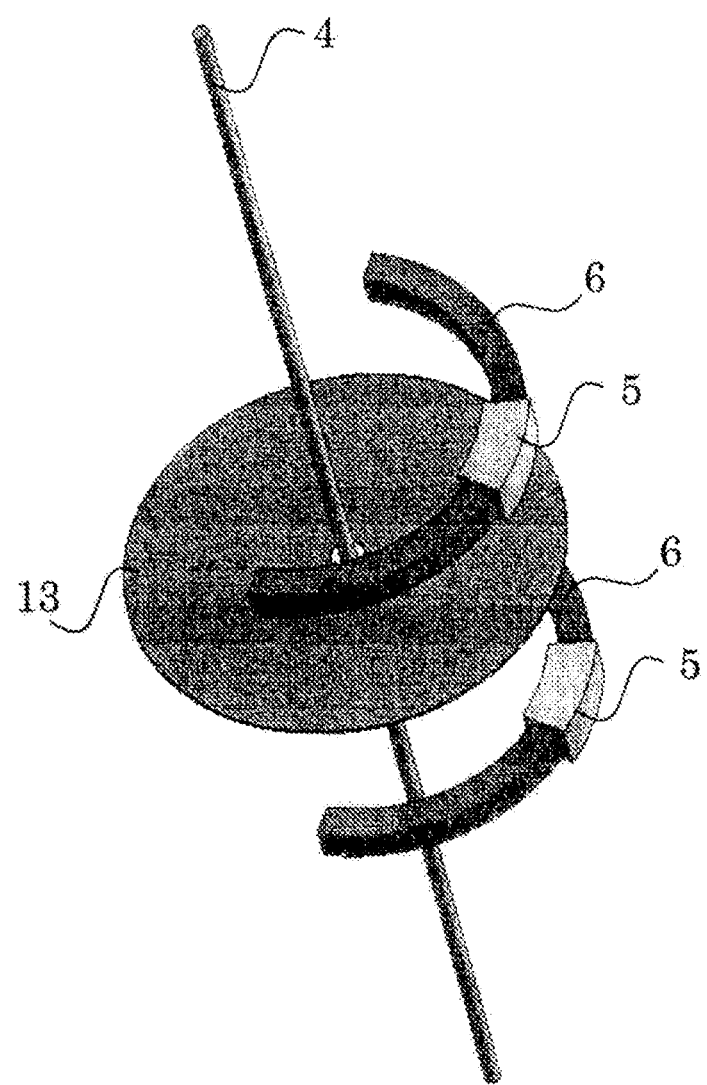
FIG. 17 shows the positional relationship between the secondary side of the transformer part and a magnetic shield plate according to Embodiment 2 of the present invention.

Thus, if a magnetic shield plate 13 is disposed between the secondary-side coils 5 as shown in FIG. 17, the secondary-side coils 5 can be disposed close to each other.

Here, as the material of the magnetic shield plate 13, a metal that is a nonmagnetic material and that has a small resistance value (for example, aluminium, copper, or the like), or a meta-material that has a negative relative magnetic permeability can be used.

Embodiment 3

Figure 18:
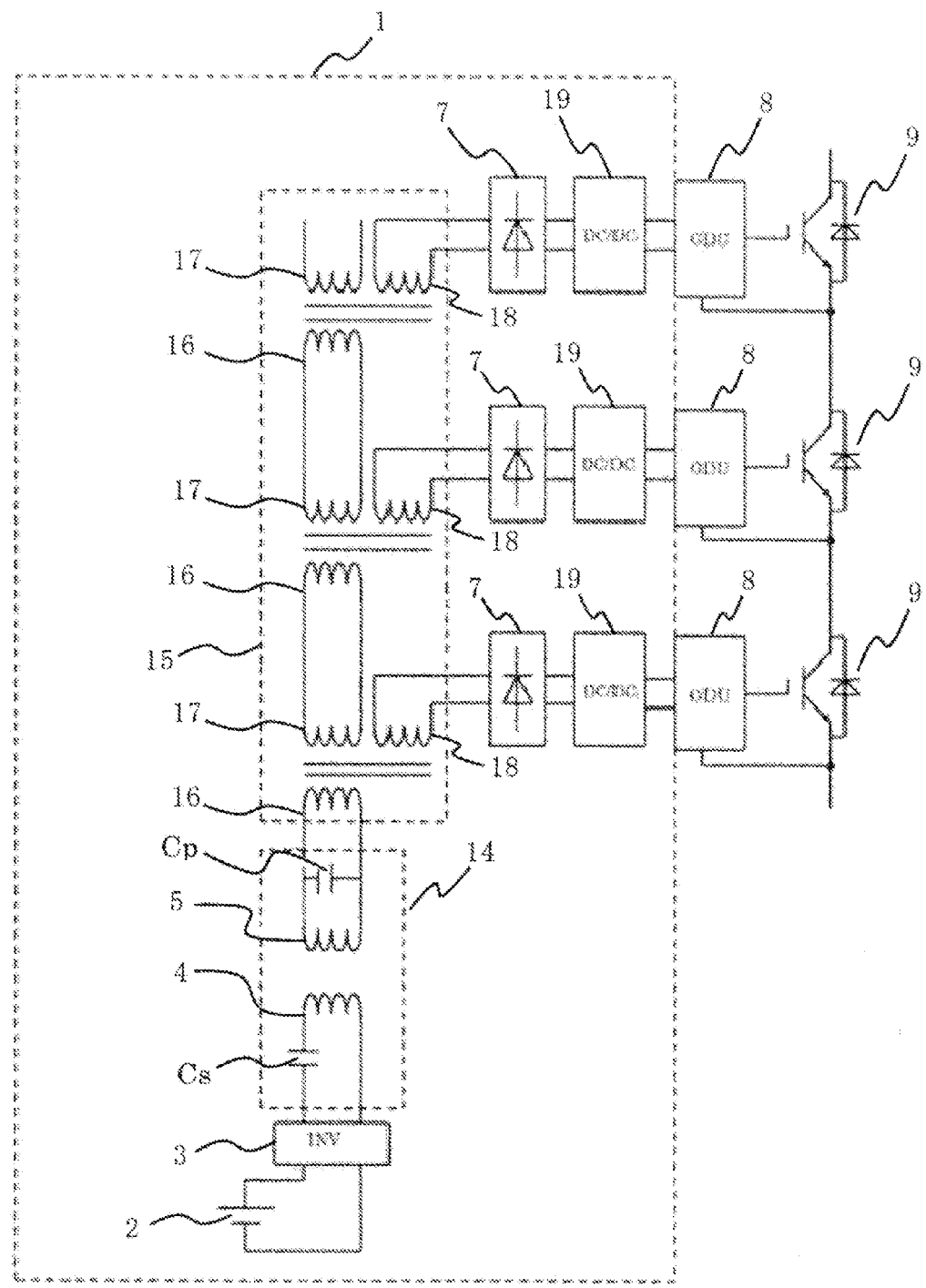
FIG. 18 shows a configuration of a gate-power-supply device using noncontact power feeding and a cascade transformer according to Embodiment 3 of the present invention.

FIG. 18 shows a configuration according to Embodiment 3 of the present invention.

The gate-power-supply device 1 includes: the DC power supply 2, the inverter circuit 3 for outputting high-frequency power from a DC power; a noncontact power feed section 14 for transmitting high-frequency power in a noncontact manner; a sequential power transfer section 15 composed of a cascade transformer for distributing the high-frequency power received at the noncontact power feed section 14 to the gates of the switching devices 9; the rectifier circuits 7 for rectifying high-frequency power distributed by the sequential power transfer section 15; and DC/DC converters 19 for respectively stepping up or stepping down the voltage of the powers rectified in the rectifier circuits 7.

The gate-power-supply device 1 supplies power from the DC/DC converters 19 to the gate drivers 8, to drive the switching devices 9 connected in series in a plurality of stages. For simple explanation, FIG. 18 shows a configuration in which switching devices are connected in series in three stages. However, configurations including three or more stages are also included in the present invention.

The noncontact power feed section 14 includes: primary-side series capacitor $C_S$ and the primary-side coil 4 which are connected in series to the inverter circuit 3; the secondary-side coil 5 spaced from the primary-side coil 4; and the secondary-side parallel capacitor $C_P$ connected in parallel to the secondary-side coil 5.

The sequential power transfer section 15 is composed of a cascade transformer formed by transformers that are cascade-connected in a plurality of stages, and sequentially transfers power supplied via the noncontact power feed section 14, to switching devices 9 adjacent to each other. When the noncontact power feed section 14 side is defined as the lower stage side, the sequential power transfer section 15 is composed of primary coils 16 on the lower stage side, secondary coils 17 on the upper stage side, and tertiary coils 18 which are connected to the rectifier circuits 7. In the sequential power transfer section 15, transformers having the same characteristics are connected in series such that an equal voltage can be outputted from the tertiary coils 18 at all the output ends of the three stages.

Figure 19:
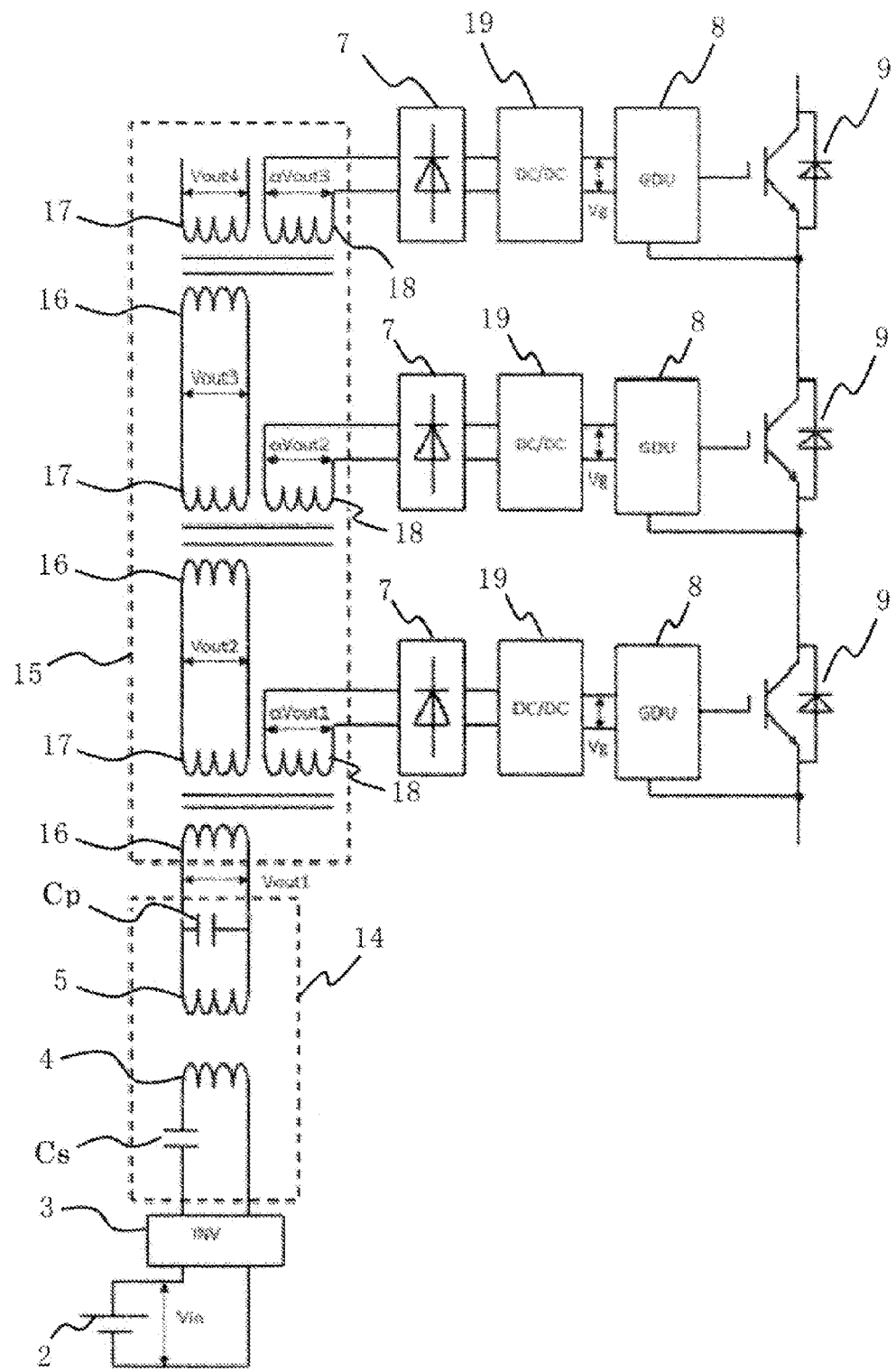
FIG. 19 shows voltage outputted from the gate-power-supply at the time of operation of the gate-power-supply device according to Embodiment 3 of the present invention.

Operation of the gate-power-supply device 1 in the present embodiment will be described. FIG. 19 shows a state at the time of operation of the gate-power-supply.

Upon supply of a voltage $V_{in}$ from the DC power supply 2, high-frequency power is supplied via the noncontact power feed section 14, an AC voltage $V_{out1}$ is outputted at the output end of the noncontact power feed section 14, and then, $V_{out2}$, $V_{out3}$, and $V_{out4}$ are sequentially outputted to the secondary coils 17 in the sequential power transfer section 15.

The voltages outputted to the secondary coils 17 of this transformer are set such that $V_{out1}=V_{out2}=V_{out3}=V_{out4}$.

Moreover, settings are made such that $\alpha V_{out1}$, $\alpha V_{out2}$, and $\alpha V_{out3}$ are sequentially outputted across both ends of the tertiary coils 18. The value of $\alpha$ may be any value.

In the case where $V_{out1}=V_{out2}=V_{out3}=V_{out4}$, $\alpha V_{out1}=\alpha V_{out2}=\alpha V_{out3}$ is established, and all the voltages outputted from the tertiary coils 18 become equal.

The voltage outputted from each tertiary coil 18 is rectified in the rectifier circuit 7, and then converted by the DC/DC converter 19 into a DC voltage $V_g$ that is necessary for driving the gate driver, thereby feeding power necessary for driving the gate driver 8.

In a semiconductor circuit breaker of a several hundred kV high-voltage DC transmission system, potential difference between the ground and the gates of the switching devices 9 also is several hundred kV, and thus, a great insulating property is required.

On the other hand, in several hundred kV high-voltage DC transmission, a large number of switching devices 9 are connected in series, and thus, the potential difference between adjacent switching devices 9 connected in series with each other is small.

Therefore, in this configuration, the gate in the first stage among the switching devices 9 connected in series in N stages (N is an integer not smaller than 2) is supplied with power by noncontact power feeding with a great insulating property of several hundred kV which can bear the voltage to ground of the DC transmission line. Then, each of the gates of the switching devices 9 in the second stage and thereafter is supplied with power by use of a cascade transformer having a small insulating property of about 1 to 10 kV which is applied to one stage for each of the switching devices 9 connected in series.

When this configuration is employed, insulation for the gates of all the switching devices 9 can be secured by using a small cascade transformer without using noncontact power feeding which requires a large setting area, and thus, the setting area can be reduced.

The voltage of each primary coil 16 and the voltage of each secondary coil 17 of the sequential power transfer section 15 are set to be the same with each other, i.e., those voltages are set so as to be $V_{out1}=V_{out2}=\ldots$. However, when a slight difference occurs between the primary coil voltage and the secondary side voltage under influence of coil resistance and the like, there are cases where the voltage of a stage in the series-connection is gradually shifted from the predetermined voltage, when the stage is at a later position in the series-connection.

In such a case, a transformer having different turns ratio may be inserted every several stages, such that the output voltage of each stage can be corrected so as to be substantially the same as the predetermined value.

In the description above, power is fed by the noncontact power feeding to the lowest stage (the lowest electric potential side) among those of the switching devices connected in series, and then, from the lowest stage, power is sequentially sent to higher-order stages by use of the cascade transformer. However, power may be fed by the noncontact power feeding to the highest-order stage, and then, from the highest-order stage, power may be sequentially sent to lower-order stages. Still alternatively, power may be sent by noncontact power feeding to an intermediate stage first, and then, from the intermediate stage, power may be sequentially sent to higher-order or lower-order stages.

When the number of switching devices connected in series is increased and the number of cascade transformers connected in series is increased accordingly, transferred power near the first stage is increased, which causes increase in the sizes of the noncontact power feed section and the cascade transformers.

Moreover, as described above, depending on the power to be fed to the gates, there are cases where the voltage to be outputted from a cascade transformer is decreased as the cascade transformer is positioned farther from the switching device in the first stage.

In such a case, a configuration may be employed in which power is supplied to gates by noncontact power feeding, for each certain number of switching devices connected in series.

Figure 20:
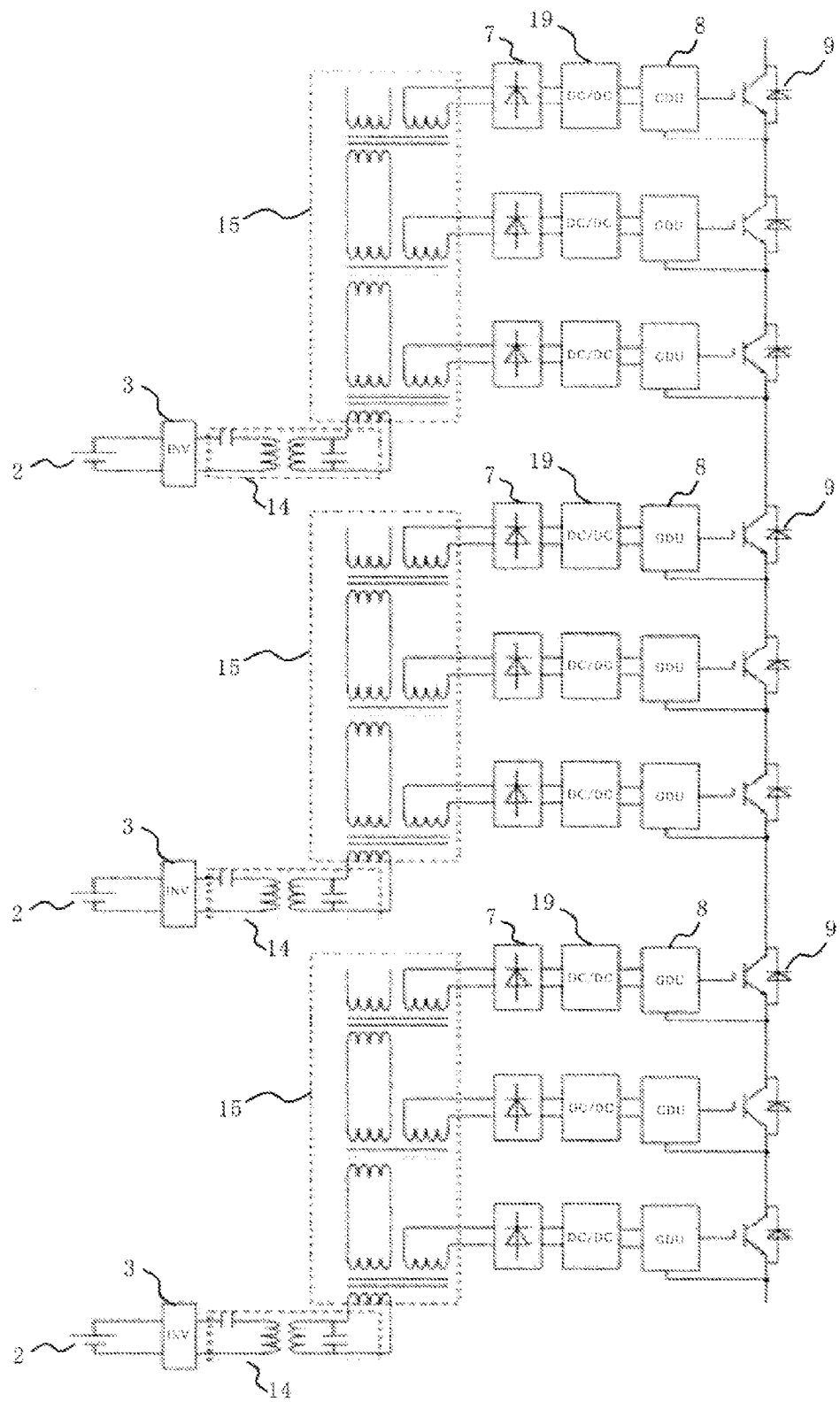
FIG. 20 shows a configuration of a device that feeds power to gate drivers in a noncontact manner, for each multiple switching devices connected in series according to Embodiment 3 of the present invention.

This configuration is shown in FIG. 20. FIG. 20 shows a configuration in which power is supplied by noncontact power feeding and a cascade transformer, for each three switching devices connected in series.

A configuration in which power is supplied by noncontact power feeding, for each three or more switching devices connected in series is also included in the present invention.

By using this configuration, it is possible to supply power to the gates by use of the cascade transformers having small insulating property. Thus, even when the number of switching devices 9 connected in series is large, it is possible to supply a constant voltage to all the gate drivers.

As described above, in Embodiment 3, the gate-power-supply device for supplying power to the gates of the switching devices 9 connected in series in N stages (N is an integer not smaller than 2) includes: the DC power supply 2; the inverter circuit 3 for converting DC power from the DC power supply 2 into high-frequency power and for outputting the high-frequency power; the noncontact power feed section 14 composed of a charge section which has the primary-side coil 4 supplied with the high-frequency power and the secondary-side coil 5 spaced from the primary-side coil 4, the noncontact power feed section 14 for feeding power to the gate of at least one switching device among the switching devices 9 connected in series; and the sequential power transfer section 15 for sequentially transferring power supplied via the noncontact power feed section 14, to the switching devices 9 adjacent to each other.

Further, in Embodiment 3, the noncontact power feed section 14 and the sequential power transfer section 15 are provided for each certain number of stages connected in series, the certain number being smaller than N.

In addition, the noncontact power feed section 14 is composed of:

the primary-side coil 4 supplied with the high-frequency power;

the primary-side series capacitor $C_3$ connected in series to the primary-side coil 4;

the secondary-side coil 5 supplied with power from the primary-side coil 4 via a high-frequency magnetic field; and the secondary-side parallel capacitor connected in parallel to the secondary-side coil 5.

The sequential power transfer section 15 is formed by use of a cascade transformer in which transformers each composed of the primary coil 16, the secondary coil 17, and the tertiary coil 18 are cascade-connected in a plurality of stages.

That is, the sequential power transfer section 15 includes transformers in N stages (three stages in FIG. 20), each transformer being composed of the primary coil 16, the secondary coil 17, and the tertiary coil 18, the primary coil 16 of the transformer in the first stage among the transformers in N stages is connected to the secondary-side coil 5 of the noncontact power feed section 14, the secondary coil 17 of the transformer in the first stage is connected to the primary coil 16 of the transformer in the second stage, the tertiary coil 18 of the transformer in the first stage is connected to the rectifier circuit 7 for rectifying high-frequency power from the noncontact power feed section 14, and connected to the gate driver 8 for feeding power from the rectifier circuit 7 via the DC/DC converter 19 to the gate of the switching device 9 in the first stage among the switching devices 9 in N stages, the primary coil 16 of the transformer in the nth (n is not smaller than 2) stage is connected to the secondary coil 17 of the transformer in the n−1th stage, the secondary coil 17 of the transformer in the nth stage is connected to the primary coil 16 of the transformer in the n+1th stage, and the tertiary coil 18 of the transformer in the nth stage is connected to the gate driver 8 in the nth stage via the rectifier circuit 7 and the DC/DC converter 19, the gate driver 8 for feeding power to the gate of the switching device 9 in the nth stage.

As described above, preferably, in the noncontact power feed section 14, the primary-side series capacitor $C_S$ is connected in series to the primary-side coil 4, and the secondary-side parallel capacitor $C_P$ is connected in parallel to the secondary-side coil 5. However, even when the output voltage of the noncontact power feed section 14 is decreased, the voltage to be supplied to the gate drivers 8 can be corrected by the DC/DC converters 19 to a predetermined value. Thus, the primary-side capacitor and the secondary-side capacitor may be connected in other ways. For example, the primary-side capacitor may be connected in series to the primary-side coil 4, and the secondary-side capacitor may be connected in series to the secondary-side coil 5. Alternatively, the primary-side capacitor may be connected in parallel to the primary-side coil 4, and the secondary-side capacitor may be connected in parallel to the secondary-side coil 5. Still alternatively, either one of or both of the primary-side capacitor and the secondary-side capacitor may be omitted.

The above description has shown a method in which a cascade transformer is used as the sequential power transfer section 15 for sequentially transferring power to adjacent switching devices connected in series. However, as long as each switching device block in which a plurality of switching devices are connected in series is supplied with high-frequency power in noncontact manner from outside the block, and inside the block, power is sequentially transferred to adjacent stages connected in series, it is also possible to employ another method for transferring power within the block.

Figure 21:
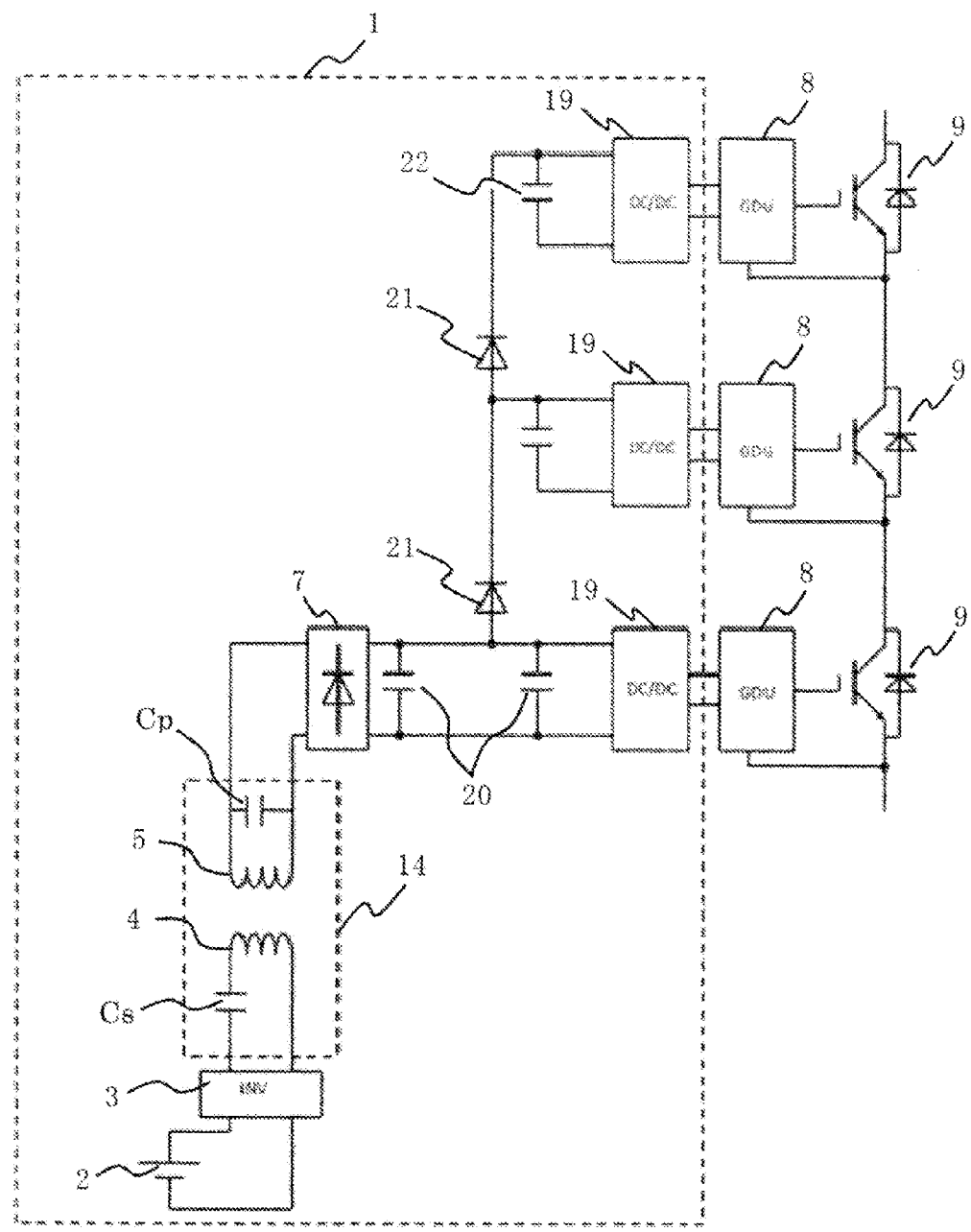
FIG. 21 shows a configuration of a gate power feed device employing a multi-stage bootstrapping scheme which uses diodes according to Embodiment 3 of the present invention.

For example, as shown in FIG. 21, a multi-stage bootstrapping scheme which uses diodes can be employed for the sequential power transfer section.

In FIG. 21, the gate-power-supply device 1 includes: a rectifier smoothing circuit composed of the rectifier circuit 7 for rectifying high-frequency power supplied from the noncontact power feed section 14 and a smoothing capacitor 20 for smoothing the power supplied from rectifier circuit 7, the rectifier smoothing circuit being connected, via the DC/DC converter 19, to the gate driver 8 for feeding power to the gate of the switching device 9 in the first stage among the switching devices 9 in N stages; and a multi-stage bootstrap section in which charging diodes 21 are connected in N−1 stages, in the multi-stage bootstrap section, an anode side of the charging diode 21 in the first stage among the charging diodes 21 connected in N−1 stages is connected to a positive output end of the rectifier circuit 7, an anode side of the charging diode 21 in the second stage is connected to a cathode side of the charging diode 21 in the first stage, and a cathode side of the charging diode 21 in the nth (n is an integer not smaller than 2 and not greater than N−1) stage is connected to an anode side of the charging diode 21 in the n+1th stage, the multi-stage bootstrap section includes: a bootstrap capacitor 22 connected to a cathode side of the charging diode 21 in the nth stage; and the DC/DC converter 19 for controlling power from the bootstrap capacitor 22 into voltage suitable for the gate of the switching device 9, and the DC/DC converter 19 is connected to the gate driver 8 for supplying power to the gate of the switching device 9.

It should be noted that details of the multi-stage bootstrapping scheme is described in Japanese Patent Application No. 2013-153443 filed by the present applicant, and thus, detailed description thereof is omitted here.

With the configuration above, with respect to portions where a large potential difference occurs that corresponds to line-to-line voltage and voltage to ground of the DC transmission line, high insulation is secured by the noncontact power feeding. At the same time, between the switching devices 9 connected in series, power is sequentially transferred by use of a small power transfer device having a low withstand voltage corresponding to the voltage applied to a switching device in one stage. Accordingly, it is possible to provide a gate-power-supply system for a semiconductor circuit breaker that is small in size and that has a high withstand voltage in total.

It is noted that, within the scope of the present invention, the above embodiments may be freely combined with each other, or each of the above embodiments may be modified or abbreviated as appropriate.

DESCRIPTION OF THE REFERENCE CHARACTERS 1 gate-power-supply device
2 DC power supply
3 inverter circuit
4 primary-side coil
5 secondary-side coil
6 transformer core
7 rectifier circuit
8 gate driver
9 switching device
10 signal line
11 control circuit
12 optical oscillator
13 magnetic shield plate
14 noncontact power feed section
15 sequential power transfer section
16 primary coil
17 secondary coil
18 tertiary coil
19 DC/DC converter
20 smoothing capacitor
21 charging diode
22 bootstrap capacitor
$C_S$ primary-side series capacitor
$C_P$ secondary-side parallel capacitor

The invention claimed is:

1. A gate-power-supply device comprising:
a DC power supply;
an inverter circuit for converting DC power from the DC power supply into high-frequency power and for outputting the high-frequency power;
a transformer composed of a primary-side coil supplied with the high-frequency power, and a plurality of secondary-side coils wound around transformer cores through which the primary-side coil passes;
a plurality of rectifier circuits for respectively rectifying high-frequency powers outputted from the respective secondary-side coils of the transformer, the plurality of rectifier circuits for respectively driving gate drivers for a plurality of semiconductor switching devices, by outputs from the rectifier circuits;
a plurality of secondary-side parallel capacitors connected in parallel to the respective secondary-side coils, the plurality of secondary-side parallel capacitors for canceling inductance components of the secondary-side coils at drive frequency of the inverter circuit;
a primary-side series capacitor connected in series to the primary-side coil, the primary-side series capacitor for canceling an imaginary term (inductance component) of a combined impedance of the gate drivers, the rectifier circuits, the secondary-side parallel capacitors, the secondary-side coils, the transformer cores, and the primary-side coil, which are a load viewed from the inverter circuit; and a sequential power transfer section is provided between the transformer and the plurality of rectifier circuits to sequentially transfer power supplied via the secondary-side coils of the transformer to the plurality of rectifier circuits, wherein the gate drivers for the plurality of semiconductor switching devices are respectively driven via the sequential power transfer section and the plurality of rectifier circuits.

2. The gate-power-supply device according to claim 1, wherein the sequential power transfer section is formed by use of a cascade transformer in which transformers each composed of a primary coil, a secondary coil, and a tertiary coil are cascade-connected in a plurality of stages, and the tertiary coils of the transformers in the respective stages are connected to the rectifier circuits respectively.

3. The gate-power-supply device according to claim 1, wherein the sequential power transfer section is formed by use of a multi-stage bootstrapping scheme which uses diodes.

4. A semiconductor circuit breaker comprising:

the gate-power-supply device according to claim 1;

a plurality of semiconductor switching devices connected in series to a transmission line in a high-voltage DC transmission system; and a plurality of gate drivers connected to the gate-power-supply device and for supplying driving powers to gates of the respective semiconductor switching devices.

5. A gate-power-supply device for supplying power to gates of semiconductor switching devices connected in series in N stages (N is an integer not smaller than 2), the gate-power-supply device comprising:

a DC power supply;

an inverter circuit for converting DC power from the DC power supply into high-frequency power and for outputting the high-frequency power;

a noncontact power feed section composed of a charge section which has a primary-side coil supplied with the high-frequency power and a secondary-side coil spaced from the primary-side coil, the noncontact power feed section for feeding power to the gate of at least one semiconductor switching device among the semiconductor switching devices connected in series; and a sequential power transfer section for sequentially transferring power supplied via the noncontact power feed section, to the semiconductor switching devices adjacent to each other.

6. The gate-power-supply device according to claim 5, wherein the noncontact power feed section and the sequential power transfer section are provided for each certain number of stages connected in series, the certain number being smaller than N.

7. The gate-power-supply device according to claim 5, wherein the noncontact power feed section is composed of:
the primary-side coil supplied with the high-frequency power;
a primary-side capacitor connected in series to the primary-side coil;
the secondary-side coil supplied with power from the primary-side coil via a high-frequency magnetic field; and a secondary-side capacitor connected in parallel to the secondary-side coil, the sequential power transfer section includes transformers in N stages, each transformer being composed of a primary coil, a secondary coil, and a tertiary coil, the primary coil of the transformer in the first stage among the transformers in N stages is connected to the secondary-side coil of the noncontact power feed section, the secondary coil of the transformer in the first stage is connected to the primary coil of the transformer in the second stage, the tertiary coil of the transformer in the first stage is connected to a rectifying diode for rectifying high-frequency power from the noncontact power feed section, and connected to a gate driver for feeding power from the rectifying diode via a DC/DC converter to the gate of the semiconductor switching device in the first stage among the semiconductor switching devices in N stages, the primary coil of the transformer in the nth (n is not smaller than 2) stage is connected to the secondary coil of the transformer in the n−1th stage, the secondary coil of the transformer in the nth stage is connected to the primary coil of the transformer in the n+1th stage, and the tertiary coil of the transformer in the nth stage is connected to a gate driver in the nth stage via a rectifying diode and a DC/DC converter, the gate driver for feeding power to the gate of the semiconductor switching device in the nth stage.

8. The gate-power-supply device according to claim 7, wherein in the transformers in the N stages, a step-up/step-down ratio between the primary coil and the secondary coil is different for each certain number of stages.

9. The gate-power-supply device according to claim 5, wherein the noncontact power feed section and the sequential power transfer section are provided for each certain number of stages connected in series, the certain number being smaller than N.

10. The gate-power-supply device according to claim 5, wherein the noncontact power feed section includes a primary-side capacitor connected in series to the primary-side coil and a secondary-side capacitor connected in series to the secondary-side coil.

11. The gate-power-supply device according to claim 5, wherein the noncontact power feed section includes a primary-side capacitor connected in parallel to the primary-side coil and a secondary-side capacitor connected in series to the secondary-side coil.

12. The gate-power-supply device according to claim 5, wherein the noncontact power feed section includes a primary-side capacitor connected in parallel to the primary-side coil and a secondary-side capacitor connected in parallel to the secondary-side coil.

13. The gate-power-supply device according to claim 5, wherein the sequential power transfer section includes:
a rectifier smoothing circuit composed of a rectifying diode for rectifying high-frequency power supplied from the noncontact power feed section and a smoothing capacitor for smoothing power supplied from the rectifying diode, the rectifier smoothing circuit being connected, via a DC/DC converter, to a gate driver for feeding power to the gate of the semiconductor switching device in the first stage among the semiconductor switching devices in N stages; and a multi-stage bootstrap section in which charging diodes connected to the rectifier smoothing circuit are connected in N−1 stages, in the multi-stage bootstrap section,
- an anode side of the charging diode in the first stage among the charging diodes connected in N−1 stages is connected to a positive output end of the rectifier smoothing circuit,
- an anode side of the charging diode in the second stage is connected to a cathode side of the charging diode in the first stage, and
- a cathode side of the charging diode in the nth (n is an integer not smaller than 2 and not greater than N−1) stage is connected to an anode side of the charging diode in the n+1th stage, the multi-stage bootstrap section includes:
- a bootstrap capacitor connected to a cathode side of the charging diode in the nth stage; and
- a DC/DC converter for controlling power from the bootstrap capacitor into voltage suitable for the gate of the semiconductor switching device, and the DC/DC converter is connected to the gate driver for supplying power to the gate of the semi conductor switching device.

14. The gate-power-supply device according to claim 5, wherein
- a reference electric potential for a transmission part of the noncontact power feed section is ground potential, and
- a spatial distance between the primary-side coil and the secondary-side coil is longer than a dielectric breakdown distance at voltage that occurs between the semiconductor switching device and the ground during high-voltage DC transmission.

15. The gate-power-supply device according to claim 5, wherein
- a withstand voltage of the sequential power transfer section is higher than voltage applied to a semiconductor switching device in one stage between the semiconductor switching devices that are adjacent to each other, and lower than voltage that occurs between the semiconductor switching device and the ground during high-voltage DC transmission.

\* \* \* \* \*